United States Patent
Cherekdjian

(10) Patent No.: US 8,652,952 B2
(45) Date of Patent: Feb. 18, 2014

(54) SEMICONDUCTOR STRUCTURE MADE USING IMPROVED MULTIPLE ION IMPLANTATION PROCESS

(75) Inventor: Sarko Cherekdjian, Campbell, CA (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/471,932

(22) Filed: May 15, 2012

(65) Prior Publication Data

US 2012/0231616 A1 Sep. 13, 2012

Related U.S. Application Data

(62) Division of application No. 12/950,376, filed on Nov. 19, 2010, now Pat. No. 8,196,546.

(51) Int. Cl.
*H01L 21/26* (2006.01)
*H01L 21/42* (2006.01)

(52) U.S. Cl.
USPC .................. 438/513; 438/798; 118/723 MP

(58) Field of Classification Search
USPC .................. 118/732 MP; 438/513, 798
See application file for complete search history.

(56) References Cited

U.S. PATENT DOCUMENTS

| | | | |
|---|---|---|---|
| 3,310,443 A | 3/1967 | John et al. | 438/56 |
| 4,914,292 A | 4/1990 | Tamai et al. | 250/251 |
| 5,083,061 A | 1/1992 | Koshiishi et al. | 315/111.81 |
| 5,189,303 A | 2/1993 | Tanjyo et al. | 250/296 |
| 5,350,926 A | 9/1994 | White et al. | 250/492.21 |
| 5,374,564 A | 12/1994 | Bruel | 438/455 |
| 5,854,123 A | 12/1998 | Sato et al. | 438/507 |
| 5,966,620 A | 10/1999 | Sakaguchi et al. | 438/455 |
| 5,985,742 A | 11/1999 | Henley et al. | 438/515 |
| 6,010,579 A | 1/2000 | Henley et al. | 148/33.2 |
| 6,013,563 A | 1/2000 | Henley et al. | 438/458 |
| 6,027,988 A | 2/2000 | Cheung et al. | 438/513 |
| 6,146,979 A | 11/2000 | Henley et al. | 438/458 |
| 6,150,239 A | 11/2000 | Goesele et al. | 438/458 |
| 6,155,909 A | 12/2000 | Henley et al. | 451/39 |
| 6,160,262 A | 12/2000 | Aoki et al. | 250/492.21 |
| 6,162,705 A | 12/2000 | Henley et al. | 438/478 |
| 6,211,041 B1 | 4/2001 | Ogura | 438/458 |

(Continued)

FOREIGN PATENT DOCUMENTS

| | | |
|---|---|---|
| JP | 62-061257 | 3/1987 |
| JP | 62053558 | 4/1987 |

(Continued)

OTHER PUBLICATIONS

F. Kroner, et al., "Phosphorus Ion Shower Implantation for Special Power IC Application," IEEE, 2000, pp. 476-479.

(Continued)

Primary Examiner — William D Coleman
Assistant Examiner — Nicholas Tobergte
(74) Attorney, Agent, or Firm — Ryan T. Hardee

(57) ABSTRACT

Methods and apparatus provide for: a first source of plasma, wherein the plasma includes a first species of ions; a second source of plasma, wherein the plasma includes a second species of ions; selection of the plasma from the first and second sources; and acceleration the first species of ions or the second species of ions toward a semiconductor wafer.

8 Claims, 5 Drawing Sheets

(56) References Cited

U.S. PATENT DOCUMENTS

| | | | |
|---|---|---|---|
| 6,245,645 B1 | 6/2001 | Mitani et al. | 438/455 |
| 6,251,754 B1 | 6/2001 | Ohshima et al. | 438/506 |
| 6,274,459 B1 | 8/2001 | Chan | 438/475 |
| 6,300,227 B1 | 10/2001 | Liu et al. | 438/513 |
| 6,303,468 B1 | 10/2001 | Aspar et al. | 438/455 |
| 6,312,797 B1 | 11/2001 | Yokokawa et al. | 428/336 |
| 6,344,404 B1 | 2/2002 | Cheung et al. | 438/513 |
| 6,350,702 B2 | 2/2002 | Sakaguchi et al. | 438/753 |
| 6,426,270 B1* | 7/2002 | Sakaguchi et al. | 438/406 |
| 6,429,104 B1 | 8/2002 | Auberton-Herve | 438/527 |
| 6,458,671 B1 | 10/2002 | Liu et al. | 438/391 |
| 6,458,672 B1 | 10/2002 | Henley et al. | |
| 6,468,884 B2 | 10/2002 | Miyake et al. | 438/481 |
| 6,468,923 B1* | 10/2002 | Yonehara et al. | 438/761 |
| 6,486,008 B1 | 11/2002 | Lee | 438/149 |
| 6,541,780 B1 | 4/2003 | Richards et al. | 250/492.2 |
| 6,544,862 B1 | 4/2003 | Bryan | 438/455 |
| 6,548,382 B1 | 4/2003 | Henley et al. | 438/526 |
| 6,566,233 B2 | 5/2003 | Yokokawa et al. | 438/455 |
| 6,597,039 B2 | 7/2003 | Ohmi et al. | 257/347 |
| 6,610,582 B1 | 8/2003 | Stewart | 438/455 |
| 6,613,678 B1 | 9/2003 | Sakaguchi et al. | 438/695 |
| 6,645,830 B2* | 11/2003 | Shimoda et al. | 438/455 |
| 6,653,209 B1 | 11/2003 | Yamagata | 438/459 |
| 6,700,631 B1* | 3/2004 | Inoue et al. | 349/45 |
| 6,852,652 B1 | 2/2005 | Maa et al. | 438/933 |
| 6,927,148 B2 | 8/2005 | Ito | |
| 7,176,528 B2 | 2/2007 | Couillard et al. | 257/347 |
| 7,202,124 B2* | 4/2007 | Fitzgerald et al. | 438/200 |
| 7,323,398 B2 | 1/2008 | Akatsu | 438/458 |
| 7,326,628 B2 | 2/2008 | Mohamed et al. | 438/458 |
| 7,449,394 B2 | 11/2008 | Akatsu et al. | 438/458 |
| 7,456,080 B2 | 11/2008 | Gadkaree | 438/407 |
| 7,608,521 B2 | 10/2009 | Cites et al. | 438/455 |
| 7,759,657 B2 | 7/2010 | Tieger et al. | 250/492.21 |
| 2002/0064924 A1 | 5/2002 | Cheung et al. | 438/400 |
| 2002/0100880 A1 | 8/2002 | Chen et al. | 250/492.21 |
| 2003/0141820 A1 | 7/2003 | White et al. | 315/111.21 |
| 2003/0183876 A1 | 10/2003 | Takafuji et al. | 257/347 |
| 2003/0234075 A1* | 12/2003 | Aspar et al. | 156/344 |
| 2004/0038504 A1 | 2/2004 | Ito | 438/520 |
| 2004/0171196 A1 | 9/2004 | Walitzki | 438/137 |
| 2004/0171232 A1 | 9/2004 | Cayrefourcq et al. | 438/458 |
| 2004/0214434 A1 | 10/2004 | Atwater et al. | 438/689 |
| 2004/0229444 A1 | 11/2004 | Couillard et al. | 438/455 |
| 2004/0232488 A1 | 11/2004 | Forbes | 257/347 |
| 2005/0026650 A1 | 2/2005 | Russell | 106/22 |
| 2005/0032330 A1 | 2/2005 | Ghyselen et al. | 438/455 |
| 2005/0040073 A1 | 2/2005 | Cody et al. | 208/89 |
| 2005/0042842 A1 | 2/2005 | Lei et al. | 438/459 |
| 2005/0070071 A1 | 3/2005 | Henley et al. | 438/459 |
| 2005/0079664 A1 | 4/2005 | Faris | 438/200 |
| 2005/0085049 A1 | 4/2005 | Atwater, Jr. et al. | 438/455 |
| 2005/0098742 A1 | 5/2005 | Kellerman et al. | 250/492.21 |
| 2005/0196936 A1 | 9/2005 | Daval et al. | 438/455 |
| 2005/0279282 A1* | 12/2005 | Park et al. | 118/723 MP |
| 2006/0019477 A1 | 1/2006 | Hanawa et al. | 438/514 |
| 2006/0038227 A1 | 2/2006 | Aitken et al. | 257/347 |
| 2006/0191627 A1* | 8/2006 | Aspar et al. | 156/249 |
| 2007/0262271 A1* | 11/2007 | Ferrara et al. | 250/492.21 |
| 2007/0281399 A1* | 12/2007 | Cites et al. | 438/149 |
| 2007/0281440 A1 | 12/2007 | Cites et al. | 438/458 |

FOREIGN PATENT DOCUMENTS

| | | |
|---|---|---|
| JP | 11-329996 | 11/1999 |
| JP | 2004-139770 | 5/2004 |
| WO | 2005/029576 | 3/2005 |
| WO | 2006/023289 | 3/2006 |
| WO | 2010-019968 | 2/2010 |

OTHER PUBLICATIONS

Agarwal et al., Efficient production of silicon-on-insulator films by co-implantation of He+ with H+, Applied Physics Letters, 1998, vol. 72, No. 9, pp. 1086-1088.

V. C. Venezia, et al, "The Role of Implantation Damage in the Production of Silicon-On-Insulator Films by Co-Implantation of He and H" Electrochemical Society Proceedings vol. 98-1 pp. 1385.

M. K. Weldon, et al, "Mechanism of silicon exfoliation induced by hydrogen/helium co-implantation", Applied Physics Letters vol. 73, No. 25, Dec. 21, 1998.

* cited by examiner

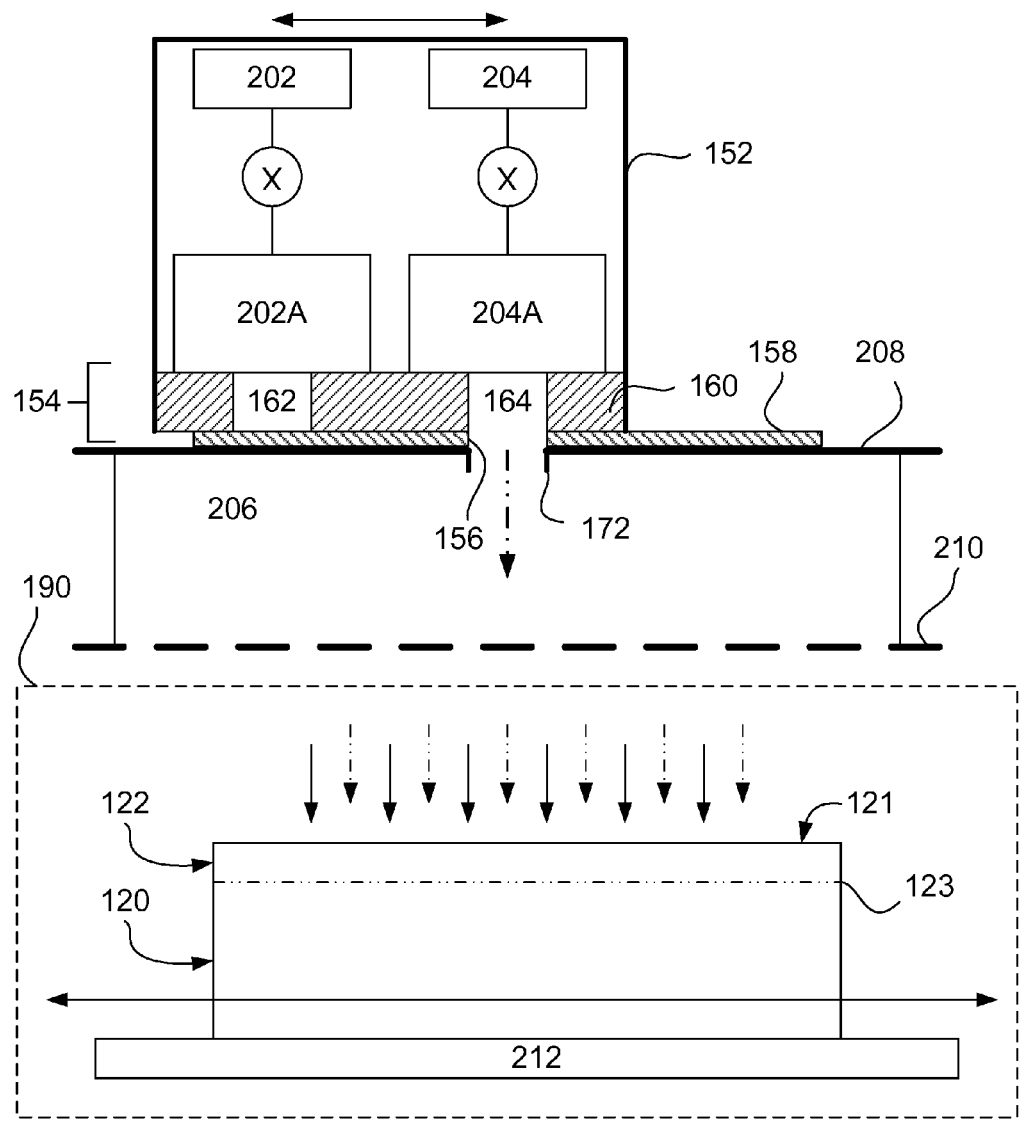

SEMICONDUCTOR STRUCTURE MADE USING IMPROVED MULTIPLE ION IMPLANTATION PROCESS

CROSS-REFERENCE TO RELATED APPLICATIONS

This is a divisional of U.S. patent application Ser. No. 12/950,376 filed on Nov. 19, 2010now U.S. Pat. No. 8,196, 546, the content of which is relied upon and incorporated herein by reference in its entirety, and the benefit of priority under 35 U.S.C. §120 is hereby claimed.

BACKGROUND

The features, aspects and embodiments disclosed herein relate to the manufacture of semiconductor devices, such as semiconductor-on-insulator (SOI) structures, using an improved multiple ion implantation process.

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, thermo-electric conversion devices, and displays, such as active matrix displays. SOI structures may include a thin layer of substantially single crystal silicon on an insulating material.

Various ways of obtaining SOI structures include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

Manufacture of SOI structures by these methods is costly. The latter method involving hydrogen ion implantation has received some attention and has been considered advantageous over the former methods because the implantation energies required are less than 50% of that of oxygen ion implants and the dosage required is two orders of magnitude lower.

U.S. Pat. No. 7,176,528 discloses a process that produces silicon on glass (SiOG) structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; (iv) cooling the structure to a common temperature; and (v) separating the glass substrate and a thin layer of silicon from the silicon wafer.

Although the manufacturing processes for making SOI structures is maturing, the commercial viability and/or application of final products employing them is limited by cost concerns. A significant cost in producing an SOI structure using the process disclosed in U.S. Pat. No. 7,176,528 is incurred during the ion implantation step. It is believed that reductions in the cost of carrying out the ion implantation process would improve the commercial application of SOI structures. Accordingly, it is desirable to continue to advance the efficiency of producing SOI structures.

Among the areas of the ion implantation process where costs are excessively high, include the resources required to prepare, and make operational, the sources of ions and the tools used for implantation. For example, when ion plasmas are employed to source ions for implantation, some type of plasma generator is required, such as an arc chamber or the like. Significant resources (time, personnel, and money) are required to make an arc chamber ready and operational. In addition, there are significant costs associated with making the semiconductor wafer (the work piece to be implanted with ions) ready to receive the ions. For example, some type of atmospheric control chamber (often called an end station) is usually employed to establish desirable conditions for implantation. These conditions may include carefully controlling vacuum, temperature, humidity, cleanliness, etc. within the chamber. Again, significant resources (time, personnel, and money) are required to make the end station ready and operational for a given ion implantation process.

The above cost issues are exacerbated when one is interested in implanting more than one species of ion into a given semiconductor wafer. Indeed, one prior art approach to multiple ion species implantation is to use a single machine approach (a single implanter set up with a single ion source) to implant one species of ion at a time. This typically involves setting up the source, accelerator equipment, and end station for one species of ion, implanting that species, and then ramping down the set up, and repeating the setup for the next species of ions. While the end station set up may remain through the transition of ion species, the transition of the ion source (including clearing the memory effect) from one species to another is very time consuming and costly.

An alternative system may employ a dual machine approach (two separate implanters, each with a dedicated ion source) to implant one species of ion at a time. This typically involves setting up both sources and accelerator equipment for both species of ion. The semiconductor wafer is placed in one of the end stations, brought to the proper atmospheric conditions, and one of the ion species is implanted. Then the semiconductor wafer is brought back to ambient conditions, transferred to the other end station, and brought back to the proper atmospheric conditions for the implantation of the second ion species. Thus, while the delays associated with transitioning a single source is reduced or eliminated, the cycling of the semiconductor wafer through two different end stations is time consuming and costly. Since transport between two end stations is required, the possibility of substrate contamination is also significantly higher in the dual machine approach.

Therefore, irrespective of which approach is employed (single or dual machine), the costs associated with preparing, and making operational, the ion sources and/or end stations used during the multiple ion species implantation processes are excessive.

There have been advancements made to the prior art approach to implanting more than one species of ion into a given semiconductor wafer. For example, one new approach is to implant both species of ions into the semiconductor wafer simultaneously. Details of this approach may be found in co-owned and co-pending U.S. Ser. No. 12/709,833, filed Feb. 2, 2010, entitled SEMICONDUCTOR STRUCTURE MADE USING IMPROVED ION IMPLANTATION PROCESS, the entire disclosure of which is incorporated herein in its entirety. While this new approach is very promising, additional research and advancements have been made, which are believed to provide reasonable alternatives, if not significant advantages, over the foregoing processes.

SUMMARY

Although the features, aspects and embodiments disclosed herein may be discussed in relation to the manufacture of semiconductor-on-insulator (SOI) structures, skilled artisans will understand that such disclosure need not be limited to SOI manufacturing. Indeed, the broadest protectable features, aspects, etc. disclosed herein are applicable to any process in which ion implantation into (or onto) semiconductor material is required, whether such semiconductor material is used in conjunction with an insulator or otherwise.

For ease of presentation, however, the disclosure herein may be made in relation to the manufacture of SOI structures. The specific references made herein to SOI structures are to facilitate the explanation of the disclosed embodiments and are not intended to, and should not be interpreted as, limiting the scope of the claims in any way. The SOI abbreviation is used herein to refer to semiconductor-on-insulator structures in general, including, but not limited to, semiconductor-on-glass (SOG) structures, silicon-on-insulator (SOI) structures, and silicon-on-glass (SiOG) structures, which also encompasses silicon-on-glass-ceramic structures. In the context of this description, SOI may also refer to semiconductor-on-semiconductor structures, such as silicon-on-silicon structures, etc.

In accordance with one or more embodiments herein, methods and apparatus of forming a semiconductor structure, include: subjecting an implantation surface of a semiconductor wafer to an ion implantation process to create an exfoliation layer therein, wherein the ion implantation process includes implanting two different species of ions into the implantation surface of the semiconductor wafer, each species being implanted within close temporal proximity to one another.

Other aspects, features, advantages, etc. will become apparent to one skilled in the art when the description of the embodiments herein is taken in conjunction with the accompanying drawings.

BRIEF DESCRIPTION OF THE DRAWINGS

For the purposes of illustrating the various aspects and features disclosed herein, there are shown in the drawings forms that are presently preferred, it being understood, however, that the covered embodiments are not limited to the precise arrangements and instrumentalities shown.

FIG. 7 is a simplified block diagram and schematic diagram of an apparatus (an ion shower implant tool) suitable for implanting a donor semiconductor wafer with ions to produce an intermediate structure useful in manufacturing the semiconductor device of FIG. 1.

DETAILED DESCRIPTION

Figure 1:
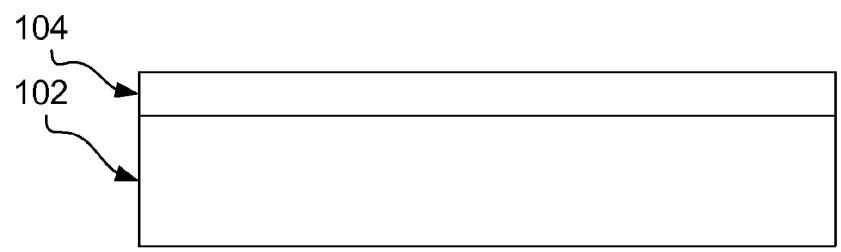
FIG. 1 is a block diagram illustrating the structure of a semiconductor device in accordance with one or more embodiments disclosed herein.

With reference to the drawings, wherein like numerals indicate like elements, there is shown in FIG. 1 a semiconductor-on-substrate structure 100 in accordance with one or more embodiments disclosed herein. In order to provide some specific context in which to discuss the broadest protectable features and aspects disclosed herein, it will be assumed that the semiconductor-on-substrate structure 100 is an SOI structure, such as a semiconductor-on-glass structure.

The SOI structure 100 may include a substrate 102, and a semiconductor layer 104. Such an SOI structure 100 may have suitable uses in connection with fabricating thin film transistors (TFTs), e.g., for display applications, including organic light-emitting diode (OLED) displays and liquid crystal displays (LCDs), integrated circuits, photovoltaic devices, etc. Although not required, the semiconductor material of the layer 104 may be in the form of a substantially single-crystal material. The word "substantially" is used in describing the layer 104 to take into account the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The substrate 102, may be any desirable material exhibiting any desirable characteristics. For example, in some embodiments, the substrate 102 may be formed from a semiconductor material, such as the above-listed varieties.

In accordance with alternative embodiments, the substrate 102 may be an insulator, such as glass, an oxide glass, or an oxide glass-ceramic. As between oxide glasses and oxide glass-ceramics, the glass may have the advantage of being simpler to manufacture, thus making them more widely available and less expensive. By way of example, a glass substrate 102 may be formed from glass containing alkaline-earth ions, such as, substrates made of CORNING INCORPORATED GLASS COMPOSITION NO. 1737 or CORNING INCORPORATED GLASS COMPOSITION NO. EAGLE 2000™. These glass materials have particular use in, for example, the production of liquid crystal displays.

While the subject matter of particular interest herein involves ion implantation into semiconductor material, it is believed that providing some additional context in terms of a specific process for manufacturing the SOI 100 is beneficial. Thus, reference is now made to FIGS. 2-5, which illustrate a general process (and resultant intermediate structures) within which the aforementioned ion implantation may be carried out in order to manufacture the SOI structure 100 of FIG. 1.

Figure 2:
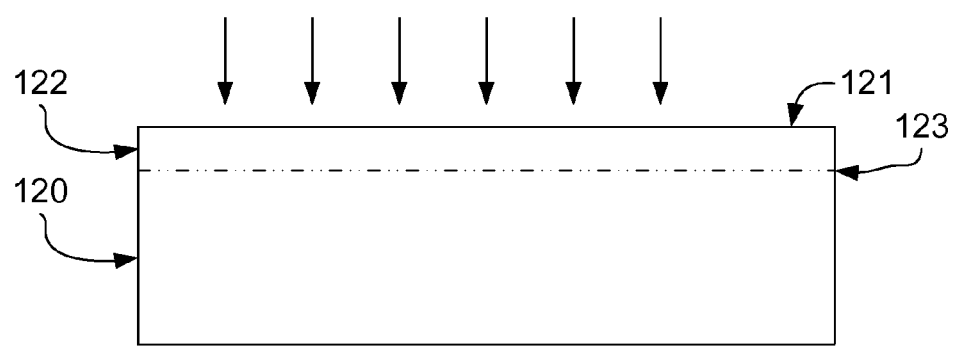
FIGS. 2-5 are schematic diagrams illustrating intermediate structures formed using processes of manufacturing the semiconductor device of FIG. 1.

Turning first to FIG. 2, a donor semiconductor wafer 120 is prepared, such as by polishing, cleaning, etc. to produce a relatively flat and uniform implantation surface 121 suitable for bonding to the substrate 102, e.g., a glass or glass-ceramic substrate. For the purposes of discussion, the semiconductor wafer 120 may be a substantially single crystal Si wafer, although as discussed above any other suitable semiconductor conductor material may be employed.

An exfoliation layer 122 is created by subjecting the implantation surface 121 to an ion implantation process to create a weakened region 123 below the implantation surface 121 of the donor semiconductor wafer 120. Although it is this ion implantation process that is the focus of the disclosure herein, at this point only general reference will be made to the process for creating the weakened region 123. Later in this description, however, a more detailed discussion of one or more ion implantation processes of specific interest will be provided. The ion implantation energy may be adjusted using to achieve a general thickness of the exfoliation layer 122, such as between about 300-500 nm, although any reasonable thickness may be achieved. The effect of ion implantation into the donor semiconductor wafer 120 is the displacement of atoms in the crystal lattice from their regular locations. When the atom in the lattice is hit by an ion, the atom is forced out of position and a primary defect, a vacancy and an interstitial atom, is created, which is called a Frenkel pair. If the implantation is performed near room temperature, the components of the primary defect move and create many types of secondary defects, such as vacancy clusters, etc.

Figure 3:
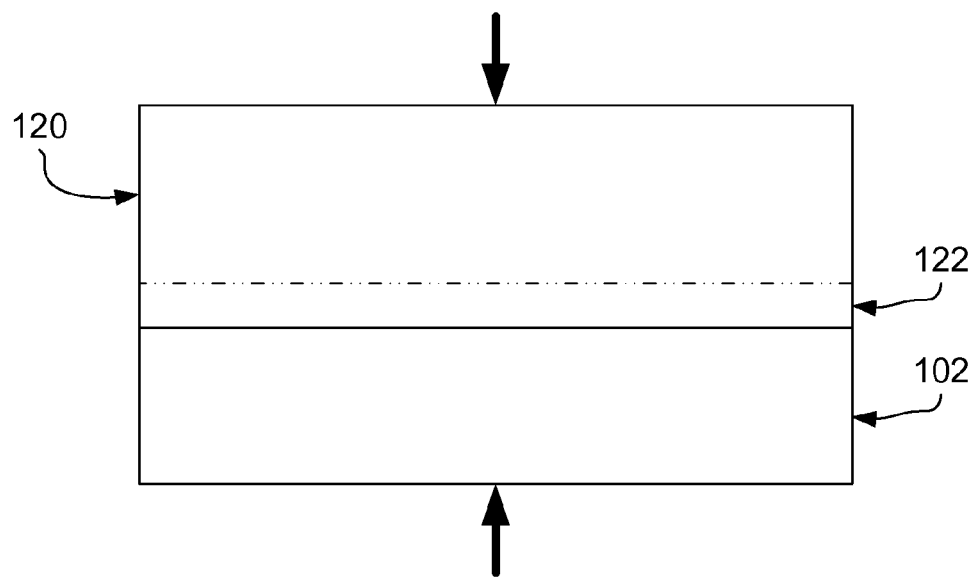

With reference to FIG. 3, the substrate 102 may be bonded to the exfoliation layer 122 using an electrolysis process (also referred to herein as an anodic bonding process). A basis for a suitable electrolysis bonding process may be found in U.S. Pat. No. 7,176,528, the entire disclosure of which is hereby incorporated by reference. Portions of this process are discussed below; however, one or more embodiments described herein are directed to modifications of the ion implantation process of U.S. Pat. No. 7,176,528.

In the bonding process, appropriate surface cleaning of the substrate 102 (and the exfoliation layer 122 if not done already) may be carried out. Thereafter, the intermediate structures are brought into direct or indirect contact. The resulting intermediate structure is thus a stack, including the bulk material layer of the donor semiconductor wafer 120, the exfoliation layer 122, and the glass substrate 102.

Prior to or after the contact, the stack of the donor semiconductor wafer 120, the exfoliation layer 122, and the glass substrate 102 is heated (indicated by the arrows in FIG. 3). The glass substrate 102 and the donor semiconductor wafer 120 are taken to a temperature sufficient to induce ion migration within the stack and an anodic bond therebetween. The temperature is dependent on the semiconductor material of the donor wafer 120 and the characteristics of the glass substrate 102. By way of example, the temperature of the junction may be taken to within about +/−350° C. of a strain point of the glass substrate 102, more particularly between about −250° C. and 0° C. of the strain point, and/or between about −100° C. and −50° C. of the strain point. Depending on the type of glass, such temperature may be in the range of about 500-600° C.

In addition to the above-discussed temperature characteristics, mechanical pressure (indicated by the arrows in FIG. 3) is applied to the intermediate assembly. The pressure range may be between about 1 to about 50 psi. Application of higher pressures, e.g., pressures above 100 psi, might cause breakage of the glass substrate 102.

A voltage (indicated by the arrows in FIG. 3) is also applied across the intermediate assembly, for example with the donor semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. More particularly, positive ions of the glass substrate 102, including substantially all modifier positive ions, migrate away from the higher voltage potential of the donor semiconductor wafer 120, forming: (1) a reduced positive ion concentration layer in the glass substrate 102 adjacent the exfoliation layer 122; and (2) an enhanced positive ion concentration layer of the glass substrate 102 adjacent the reduced positive ion concentration layer. This formation results in barrier functionality, i.e., preventing positive ion migration back from the oxide glass or oxide glass-ceramic, through the reduced positive ion concentration layer, and into the semiconductor layer.

Figure 4:
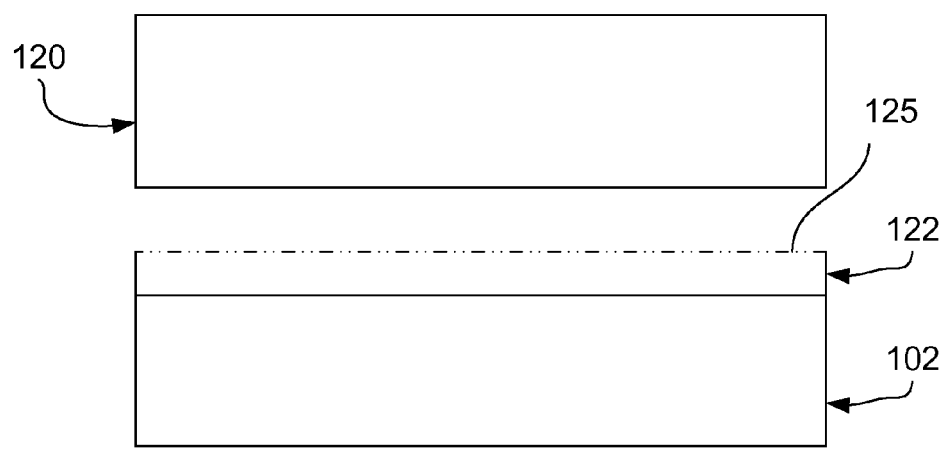
Figure 5:
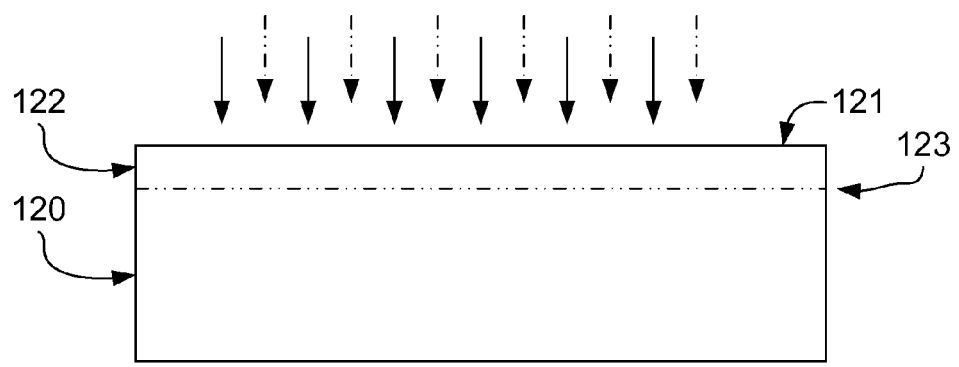

With reference to FIG. 4, after the intermediate assembly is held under the conditions of temperature, pressure and voltage for a sufficient time, the voltage is removed and the intermediate assembly is allowed to cool to room temperature. At some point during heating, during a dwell, during cooling, and/or after cooling, the donor semiconductor wafer 120 and the glass substrate 102 are separated. This may include some peeling if the exfoliation layer 122 has not already become completely free from the donor 120. The result is a glass substrate 102 with the relatively thin exfoliation layer 122 formed of the semiconductor material of the donor semiconductor layer 120 bonded thereto. The separation may be accomplished via fracture of the exfoliation layer 122 due to thermal stresses. Alternatively or in addition, mechanical stresses such as water jet cutting or chemical etching may be used to facilitate the separation.

The cleaved surface 125 of the SOI structure 100, just after exfoliation, may exhibit surface roughness, excessive silicon layer thickness, and/or implantation damage of the silicon layer (e.g., due to the formation of an amorphized silicon layer). Depending on the implantation energy and implantation time, the thickness of the exfoliation layer 122 may be on the order of about 300-500 nm, although other thicknesses may also be suitable. These characteristics may be altered using post bonding processes in order to advance from the exfoliation layer 122 and produce the desirable characteristics of the semiconductor layer 104 (FIG. 1). It is noted that the donor semiconductor wafer 120 may be reused to continue producing other SOI structures 100.

Reference is now made to FIG. 5, which is again directed to the creation of the exfoliation layer 122 by subjecting the implantation surface 121 of the donor semiconductor wafer 120 to an ion implantation process to create the weakened region 123 below the implantation surface 121 of the donor semiconductor wafer 120. In accordance with one or more embodiments, the ion implantation process includes implanting two different species of ions into the implantation surface 121 of the donor semiconductor wafer 120. In accordance with preferred aspects, the two different species of ions are implanted one after the other, serially, using an improved apparatus and process.

Figure 6:
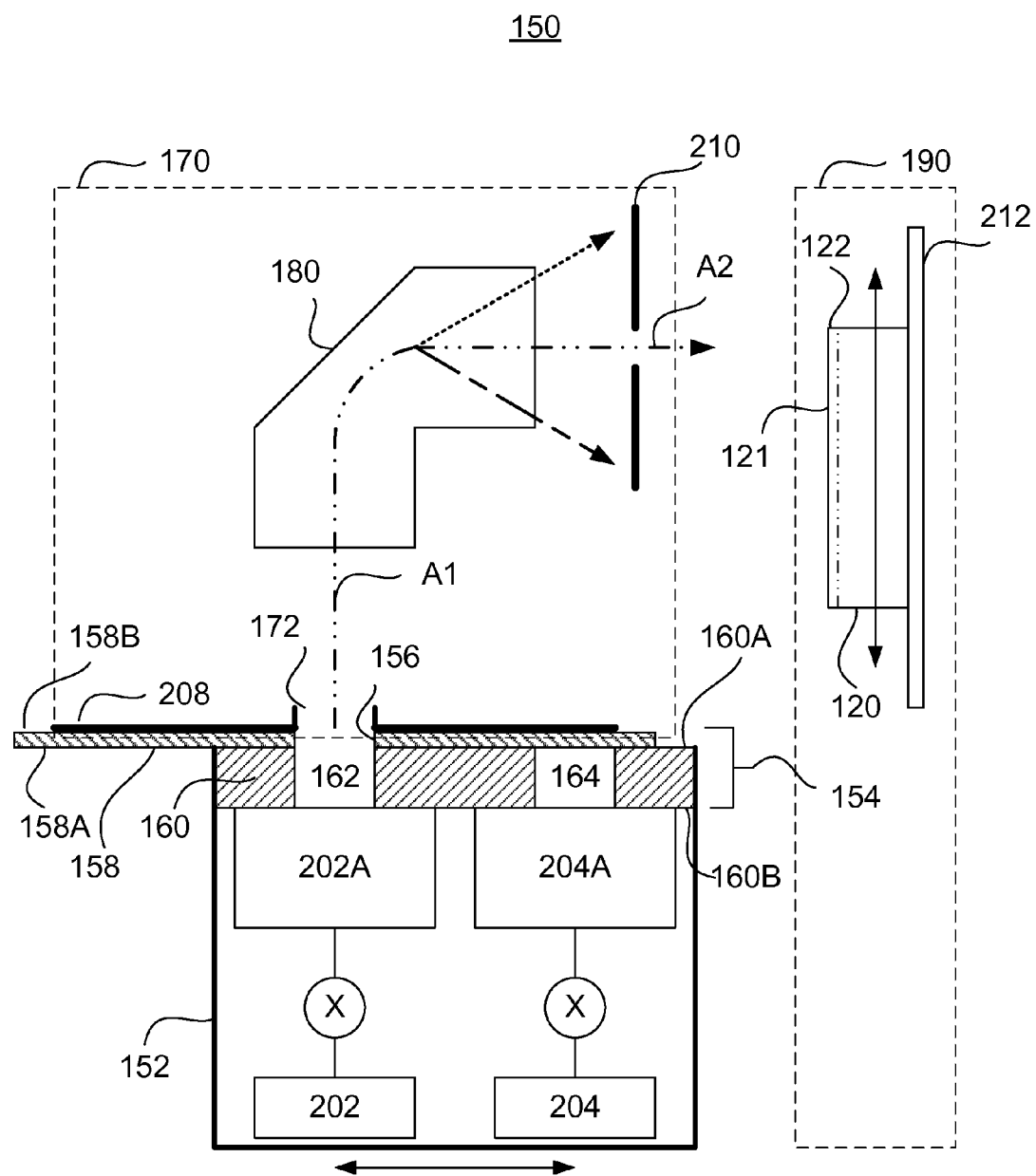
FIG. 6 is a simplified block diagram and schematic diagram of an apparatus (a single beam implant tool) suitable for implanting a donor semiconductor wafer with ions to produce an intermediate structure useful in manufacturing the semiconductor device of FIG. 1.

With reference to FIG. 6, the implantation of the two different types of ions may be carried out in a single beam implant tool 150. Such a tool 150 may be purchased commercially and then modified to achieve the process described herein, or a substantially new tool may be developed. As the design and operating principle of implant tools may differ, the specific modifications in equipment and/or operation will be left to the skilled artisan, but should be based on the description herein.

The ion implant tool 150 of FIG. 6 is illustrated in high-level schematic form and includes a source 152 of plasma, which itself includes first and second sources of plasma. More particularly, the source 152 includes first and second sources of gas, e.g. a first tank 202 and a second tank 204, each feeding a respective chamber 202A, 204A. The tanks 202, 204 are areas that produce the gas vapor required for the plasma generation in the plasma chamber. The tanks 202, 204 may contain gases, liquids or solids. For liquids and solids, a level of heating is required to generate the gas vapors. For gaseous sources, each of the tanks 202, 204 includes a respective gas, which contains a respective species of atoms and/or molecules. By way of example, the first tank 202 may contain atoms and/or molecules of hydrogen, and the second tank 204 may contain atoms and/or molecules of helium. Other atom and/or molecule species are also possible, such as being taken from the group consisting of: boron, hydrogen, helium, and/or other suitable species of atoms.

In accordance with one or more embodiments, one or both of the respective chambers 202A, 204A may include the structural elements necessary to produce plasma from the gas associated therewith. For example, the first chamber 202A may be implemented using an arc chamber, which includes the magnets, filaments, reflectors, energy sources, etc. necessary to receive the gas from the tank 202 and produce a first source of plasma. Similar structure may be included in the second chamber 204A. It is understood that those skilled in the art are well aware of the basic structural elements necessary to produce plasma from gas using, for example an arc chamber. It is understood, however, that any other suitable and known technique for producing plasma from gas may additionally or alternatively be employed. Thus, the first source of plasma (first plasma), which includes a first species of ions, may be produced within the first chamber 202A, and the second source of plasma (second plasma), which includes a second, differing, species of ions, may be produced within the second chamber 204A.

Those skilled in the art will appreciate that, depending on the species of atoms within the gas, the plasma may include differing types of ions, while still being within a species. For example, in the case of hydrogen, the first plasma may include H ions, $H_2$ ions, and $H_3$ ions. In the case of helium, the second plasma may include substantially only $He_4$ ions.

The source 152 is in communication with a mechanism 154 for selectively (and serially) providing the first plasma and the second plasma to the next phase of the system 150, which is an accelerator system 170. The mechanism 154 may be implemented as a sliding seal system 154, whereby a serial delivery of plasma is attained in which the first plasma is provided to the accelerator system 170 for a certain period of time, and, thereafter, the second plasma is provided to the accelerator system 170. The seal system 154 operates in at least two states: (i) a first state in which the first plasma is permitted to pass through an outlet 156 (and into the accelerator system 170) and the second plasma is sealed off (e.g., the source 204, 204A is in an idle state or setup), and (ii) a second state in which the second plasma is permitted to pass through the outlet 156 (into the accelerator system 170) and the first plasma is sealed off (e.g., the source 202, 202A is in an idle state or setup). An idle state or setup for the first and second plasma sources may be a condition whereby the source parameters are minimized while still maintaining plasma within the given chamber 202A, 204A. An idling plasma setup can be rapidly altered to a high-current generating plasma thus drastically minimizing process setup times from either a cold start or a gas and/or vapor changing plasma.

More particularly, the seal system 154 includes a first plate 158, and a second plate 160. The first plate 158 (which may be a single plate or multiple pieces) includes a first surface 158A, an opposing second surface 158B, and the outlet 156 (which is shown as an aperture) extending through the first plate 158. The outlet 156 is in communication with an inlet or input 172 of the accelerator system 170. The second plate 160 (which also may be a single plate or multiple pieces) includes a first surface 160A, an opposing second surface 160B, and at least first and second ports 162, 164 extending therethrough. The first port 162 is in communication with the plasma output of the first chamber 202A, and the second port 164 is in communication with the plasma output of the second chamber 204A.

The first surfaces 158A, 160A of the first and second plates 158, 160 are in sliding communication with one another. In the first state, the first port 162 is in registration with the aperture of the outlet 156 of the first plate 158, thereby permitting the first plasma to pass through the outlet 156 and into the accelerator system 170. In the first state, the second port 164 is sealed off against the first surface 158A of the first plate 158. In the second state, the second port 164 is in registration with the aperture of the outlet 156, thereby permitting the second plasma to pass through the outlet 156 and into the accelerator system 170. In the second state, the first port 162 is sealed off against the first surface 158A of the first plate 158. Thus, the first and second plates 158, 160 operate to slide with respect to one another to move the first and second ports 162, 164 into, and out of, registration with the outlet 156 in order to select the desired plasma.

Those skilled in the art will appreciate that there are many suitable variations in the structural details of the sliding seal system 154. Among these variations is an approach in which the source 152, which includes the first and second sources of plasma (e.g., elements 202, 202A, 204, and 204A), are mechanically coupled to the second plate 160, such that the source 152 slides along with the plate 160. Such translation of the source 152 and the second plate 160 is illustrated by the bi-directional arrow of FIG. 6.

As discussed earlier herein, those skilled in the art will appreciate that there is a substantial amount of time needed to ramp up the first and second chambers 202A, 204A from a cold start to a status suitable for producing the respective first and second plasma. Indeed, the magnets, filaments, reflectors, energy sources, etc. must all ramp up and settle into proper conditions for plasma generation. Maintaining the first and second chambers 202A, 204A in an idle mode, however, eliminates the cold start up delays. As will be discussed further herein, each of the first and second chambers 202A, 204A may be easily and quickly ramped up from the idle mode and ready to produce high-density plasmas, and selection between the first and second plasma may be attained by way of the sliding seal system 154. This permits rapid selection between the differing plasmas for rapid delivery into the accelerator system 170. This rapid selectivity has significant cost saving advantages, at least because there need not be a first set up for the first plasma, followed by a ramp down and re-set up for the second plasma. This advantage in addition to others will be discussed further with relation to other aspects of the system 150 that have yet to be presented.

The outlet 156 of the sliding seal system 154 is in communication with the input (or inlet) 172 of the accelerator system 170, which includes an analyzer magnet 180. In general, the accelerator system 170 operates to accelerate the first species of ions from the plasma toward the semiconductor wafer 120 only when the seal system 154 is in the first state (the first plasma is selected). Similarly, the accelerator system 170 operates to accelerate the second species of ions from the plasma toward the semiconductor wafer 120 only when the seal system 154 is in the second state (the second plasma is selected).

The plasma input 172 of the accelerator system 170 receives the first plasma from the outlet 156 of the sliding seal system 154 when the seal system is in the first state. The analyzer magnet system 180 operates to alter a trajectory of the first species of ions from the first plasma, thereby producing at least one first ion beam through the output thereof. More specifically, the accelerator system 170 includes any number of electrodes, two such electrodes 208, 210 being shown for example. An appropriate voltage potential (which may be in the range of 10's to 100's of K volts) between the electrodes 208, 210 will cause the first species of ions to accelerate toward and through the magnet 180.

The accelerator system 170 accelerates the first species of ions from the first plasma at an appropriate magnitude toward the analyzer magnet 180 along a first axis, A1. The change in trajectory of the first ions from the first plasma within the analyzer magnet 180 will depend on a number of factors, including the strength of the magnetic field produced by the analyzer magnet 180, the mass of the ions, the acceleration magnitude (and the resultant momentum and velocity) of the ions as they pass through the magnet 180, etc., all of which are known in the art. Assuming that the first plasma contains hydrogen ion species, and assuming that the above (and other factors) are established to ensure that the H2 ions of the first plasma are desired for the first ion beam, such first ion beam will leave the output of the analyzer magnet system 180 along a second axis, A2, transverse to the first axis, A1. An aperture through the second electrode 210 permits the first ion beam to leave the accelerator system 170 and proceed to the semiconductor wafer 120.

For example, the implantation of $H_2$ ions can occur as the H ions are lighter than the $H_2$ ions, the change of trajectory of the H ions is more radical than the $H_2$ ions and they do not leave the accelerator system 170. Similarly, the $H_3$ ions are heavier than the $H_2$ ions, and the change of trajectory of the $H_3$ ions is less radical than the $H_2$ ions, and they also do not leave the accelerator system 170.

The plasma input 172 of the accelerator system 170 receives the second plasma from the outlet 156 of the sliding seal system 154 when the seal system is in the second state. Again, the analyzer magnet system 180 operates to alter a trajectory of the second species of ions from the second plasma, thereby producing at least one second ion beam, comprising the second species of ions, through the output thereof. As the second species of ions may not, and probably does not, exhibit the same mass as the first species of ions, certain operational characteristics of the accelerator system 170 are available. Specifically, the accelerator system 170 is controllable into at least two states, preferably by way of computer control. The first state is characterized by the first species of ions from the first plasma being accelerated at a first magnitude from the outlet 156 of the seal system 154 along the first axis, A1, and through the analyzer magnet system 180. The second state is characterized by the second species of ions from the second plasma being accelerated at a second magnitude, equal to or different from the first magnitude, from the outlet 156 of the seal system 154 along the first axis, A1, and through the analyzer magnet system 180, such that a second ion beam leaves the output of the analyzer magnet system along the second axis, A2.

By way of example, in the case of the second species of ions being helium (as opposed to the example of the first species of hydrogen ions), the potential of the electrodes 208, 210 of the accelerator system 170 are adjusted (preferably automatically in accord with the state of the sliding seal system 154) in order to achieve the proper acceleration of the second species of ions. The $He_4$ ions are of a higher mass than $H_2$, so the interaction of the second species of Helium-4 ions through the magnet 180 needs to be different than that of hydrogen-2 ions in order to exit the accelerator system along the second axis, A2. For example, the analyzer magnet 180 setting may be altered to accommodate the selected ions and to ensure that they track along the second axis A2. The analyzer magnet setting 180 (the magnitude and/or direction of the magnetic force produced) will depend upon the curvature of the ion trajectory (set by the analyzer bend—a machine constant, e.g., typically 60 or 90 degrees), the selected ion mass, its charge state, and its accelerated voltage attained from the electrode 208.

The system 150 also includes an end station 190 operating to support and translate the semiconductor wafer 120 such that the first and second species of ions, separately and serially, bombard the implantation surface 121 to create the exfoliation layer 122 therein. The end station 190 includes a transport mechanism 212, which permits the semiconductor wafer 120 to translate, or scan, (see the bi-directional arrow) in appropriate directions, such that the respective ion beams paint the semiconductor wafer 120 and suitable target doses (one for each ion species) are achieved. In an alternative end station configuration, rotating process disks may be employed to rotate the semiconductor wafer 120 through the ion beams, as opposed to the relatively linear translation of the semiconductor wafer shown in FIG. 6.

The end station 190 also operates to maintain a controlled atmosphere within which the semiconductor wafer 120 is disposed during implantation. Preferably, the atmosphere includes a suitable vacuum, temperature, humidity, cleanliness, etc. In this regard, the end station 190 includes an input in communication with the output from the accelerator system 170, whereby the ion beams may be received, but the controlled atmosphere is not lost.

The end station 190 operates to maintain the semiconductor wafer 120 within the controlled atmosphere during the implantation of the first ion species, during a transition of the seal system from the first state to the second state (and a corresponding transition of the accelerator system 170 from the first state to the second state), and during the implantation of the second ion species.

The ability to rapidly transition between the first and second plasma and maintain the atmospheric conditions within the end station 190 during the entire period from: (i) implantation of the first ion species, (ii) the transition of the first plasma to the second plasma, and (iii) implantation of the second ion species, saves considerable time as compared to the alternatives: a single implanter (with a single ion source) solution and a two ion implanter (each with a separate ion source) solution. Indeed, in the system 150 of FIG. 6, ramping up each chamber 202A, 204A from an idle mode (typically where low density plasma is produced) to an operational mode in which high density plasma is produced involves very little time as compared to the single machine approach (where a single chamber must be serially set up for each ion species). Further, in the system 150 the semiconductor wafer 120 may be maintained in the proper atmospheric conditions (in the same end station) through the transition from the first plasma to the second plasma (as compared to the dual machine approach where time for transitioning between end stations is required). The utilization of a single system 150 that eliminates delays associated with a single chamber approach and a dual end station approach results in a superior process with very significant cost savings.

With reference to FIG. 7, the implantation of the two different types of ions may be carried out in an ion shower implant tool 200. Such an ion shower tool 200 may be purchased commercially and then modified to achieve the process described herein, or a substantially new tool may be developed. As the design and operating principle of implant tools may differ, the specific modifications in equipment and/or operation will be left to the skilled artisan, but should be based on the description herein.

The ion shower tool 200 of FIG. 7 is illustrated in high-level schematic form. As with the prior embodiment, the tool 200 includes the source 152 and sliding seal mechanism 154, the details of which will not be repeated. The outlet 156 of the seal system 154 communicates with the input of a plasma chamber 206. The plasma chamber 206 includes a first electrode 208, a second electrode (grid) 210. An end station of the system 200 includes a transport mechanism 212, which supports and translates (scans) the semiconductor wafer 120 in a suitable position with respect to the output of the plasma chamber 206.

Conditions are established within the chamber 206 to ensure that desirable ion acceleration and energy levels are achieved to accelerate the first plasma, followed serially by the second plasma. For example, ions in the plasma entering the chamber 206 may be accelerated towards the donor semiconductor wafer 120 by way of an electric field between the first and second electrodes 208, 210. (It is noted that in a practical piece of equipment, there may be one or more additional electrodes, not shown, which contribute to and/or produce the required plasma and acceleration.) The field may be of sufficient magnitude to accelerate the respective ions to an energy of between about 25-150 KeV, such as about 80 KeV. As the second electrode 210 is in the form of a grid, the ions may pass therethrough and strike the implantation surface 121 of the donor semiconductor wafer 120 and become implanted in the donor semiconductor. The energy to which the first and second ions are accelerated is selected such that the ions are implanted in the donor semiconductor wafer to the desired depth, e.g. approximately along the desired weakened region 123 below the implantation surface 121 of the donor semiconductor wafer 120. The conditions of the chamber 206 are adjustable between at least two states, one state for appropriate acceleration of the first species of ions from the first plasma, and another state for appropriate acceleration of the second species of ions from the second plasma.

The end station 190 operates to support and translate the semiconductor wafer 120 such that the first and second species of ions, separately and serially, bombard the implantation surface 121 to create the exfoliation layer 122 therein. The transport mechanism 212 permits the semiconductor wafer 120 to translate, or scan, in appropriate directions, such that the respective ion beams paint the semiconductor wafer 120 and suitable target doses (one for each ion species) are achieved. The end station 190 also operates to maintain the aforementioned controlled atmosphere within which the semiconductor wafer 120 is disposed during implantation. Such atmosphere is maintained during the implantation of the first ion species, during a transition of the seal system 154 (and the acceleration components) from the first state to the second state, and during the implantation of the second ion species. Again, in an alternative end station configuration, rotating process disks may be employed to rotate the semiconductor wafer 120 through the ion beams, as opposed to the linear translation of the semiconductor wafer shown in FIG. 7.

While the above embodiments have been discussed with specific reference to the structure of the respective tools 150, 200, one skilled in the art will appreciate that inventive aspects apply to one or more processes as well.

In this regard, a method of forming a semiconductor structure may include: providing a first source of plasma (first plasma), which includes a first species of ions; providing a second source of plasma (second plasma), which includes a second, differing, species of ions; employing a mechanical mechanism to selectively: (i) permit the first plasma to pass through an outlet and seal off the second plasma, and (ii) permit the second plasma to pass through the outlet and seal off the first plasma; and serially receiving from the outlet, and accelerating, the selected first or second plasma, respectively, toward a semiconductor wafer to serially bombard an implantation surface of the semiconductor wafer with the first and second species of ions, respectively, thereby creating an exfoliation layer therein.

The method may further include one or more of: disposing the semiconductor wafer in an end station providing a controlled atmosphere during the implantation; maintaining the semiconductor wafer within the end station, and maintaining the controlled atmosphere during a transition of the mechanical mechanism from selecting the first plasma to selecting the second plasma. The method may employ maintaining a vacuum within the end station during implantation.

The method may further include: translating the semiconductor wafer through the first species of ions when the first plasma is selected; and translating the semiconductor wafer through the second species of ions when the second plasma is selected.

The method may further include: accelerating the first species of ions from the first plasma, when selected, at a first magnitude along a first axis and applying a magnitude of magnetic force to alter a trajectory of the first species of ions from the first plasma to a second axis, transverse to the first axis, toward and into the semiconductor wafer; and accelerating the second species of ions from the second plasma, when selected, at a second magnitude, different from the first magnitude, along the first axis and applying the same magnitude of magnetic force to alter a trajectory of the second species of ions from the second plasma to the second axis toward and into the semiconductor wafer.

Although the aspects, features, and embodiments disclosed herein have been described with reference to particular details, it is to be understood that these details are merely illustrative of broader principles and applications. It is therefore to be understood that numerous modifications may be made to the illustrative embodiments and that other arrangements may be devised without departing from the spirit and scope of the appended claims.

The invention claimed is:

1. A method of implanting two species of ions into a semiconductor wafer, comprising:
   providing a first source of plasma (first plasma), which includes a first species of ions;
   providing a second source of plasma (second plasma), which includes a second, differing, species of ions;
   employing a mechanical mechanism to selectively: (i) permit the first plasma to pass through a first outlet and seal off the second plasma in a first state, and (ii) permit the second plasma to pass through the first outlet and seal off the first plasma in a second state; and
   serially receiving from the first outlet (1) the first plasma and then (2) the second plasma, and serially (1) accelerating the first species of ions from the first plasma toward a semiconductor wafer and then (2) accelerating the second species of ions from the second plasma toward a semiconductor wafer, to serially bombard an implantation surface of the semiconductor wafer with the first and second species of ions, thereby creating an exfoliation layer therein.

2. The method of claim 1, further comprising disposing the semiconductor wafer in an end station providing a controlled atmosphere during the implantation.

3. The method of claim 2, further comprising maintaining the semiconductor wafer within the end station, and maintaining the controlled atmosphere during a transition of the mechanical mechanism from selecting the first plasma to selecting the second plasma.

4. The method of claim 3, further comprising maintaining a vacuum within the end station during implantation.

5. The method of claim 3, further comprising:
translating the semiconductor wafer through the accelerated first species of ions when the first plasma is selected; and
translating the semiconductor wafer through the accelerated second species of ions when the second plasma is selected.

6. The method of claim 1, further comprising:
accelerating the first species of ions from the first plasma, when selected, at a first magnitude along a first axis and applying a first magnitude of magnetic force to alter a trajectory of the first species of ions from the first plasma to a second axis, transverse to the first axis, toward and into the semiconductor wafer; and
accelerating the second species of ions from the second plasma, when selected, at a second magnitude along the first axis and applying a second magnitude of magnetic force to alter a trajectory of the second species of ions from the second plasma to the second axis toward and into the semiconductor wafer.

7. The method of claim 1, wherein the first and second species of ions are taken from the group consisting of: boron, hydrogen, and helium.

8. The method of claim 1, wherein the mechanical mechanism comprises a seal system having (i) a first plate having a first surface and an opposing second surface, the first outlet having a first aperture extending through the first plate and (ii) a second plate having a first surface slidably in contact with the opposing second surface of the first plate and the second plate having a first port and a second port therethrough, each port adaptable to communicate with the first outlet via the first aperture, and wherein the step of employing further comprises:
in the first state, slidably registering the first port with the first aperture of the first outlet to permit the first plasma to pass through the first outlet and slidably sealing the second port against the first surface of the first plate, and
in the second state, slidably registering the second port with the first aperture of the first outlet to permit the second plasma to pass through the first outlet and slidably sealing the first port against the first surface of the first plate.

* * * * *